United States Patent [19]
Gaudet

[11] Patent Number: 6,037,812
[45] Date of Patent: Mar. 14, 2000

[54] DELAY LOCKED LOOP (DLL) BASED CLOCK SYNTHESIS

[75] Inventor: Brian Gaudet, San Jose, Calif.

[73] Assignee: National Semiconductor Corporation, Santa Clara, Calif.

[21] Appl. No.: 09/080,623

[22] Filed: May 18, 1998

[51] Int. Cl.[7] .................................................. H03B 19/00
[52] U.S. Cl. ........................ 327/116; 327/166; 327/291
[58] Field of Search .................................... 327/113, 116, 327/119, 165, 166, 270, 291, 293

[56] References Cited

U.S. PATENT DOCUMENTS

| 5,786,715 | 7/1998 | Halepete | 327/116 |
| 5,838,178 | 11/1998 | Marbot | 327/116 |

*Primary Examiner*—Timothy P. Callahan
*Assistant Examiner*—Jeffrey Zweizig
*Attorney, Agent, or Firm*—Limbach & Limbach LLP

[57] ABSTRACT

In a delay locked loop (DLL) based clock signal synthesizer, which overcomes the accumulated jitter and reference clock noise problems of VCO based circuits, the VCO is replaced by a multi-stage delay line formed by differential variable delay elements. The outputs of the delay stages are fed into differential XOR gates. The outputs from the differential XOR gates are fed into a multi-input differential NOR gate. Both the reference clock and delay line output are the inputs to a phase comparator contained in a DLL loop logic block which converts the differential inputs to single ended and uses a digital loop to provide proportional control to correct any detected phase error. The output of the digital loop logic is a vector used to control a current digital-to-analog converter, which is used to mirror a control current to the delay stages of the delay line. The amount of mirrored current controls the delay of the delay stages. The frequency multiplication factor of the clock generating circuit may be adjusted by changing the number of delay elements in the delay chain formed. The period of the synthesized clock signal will be proportional to the number of delay elements.

2 Claims, 9 Drawing Sheets

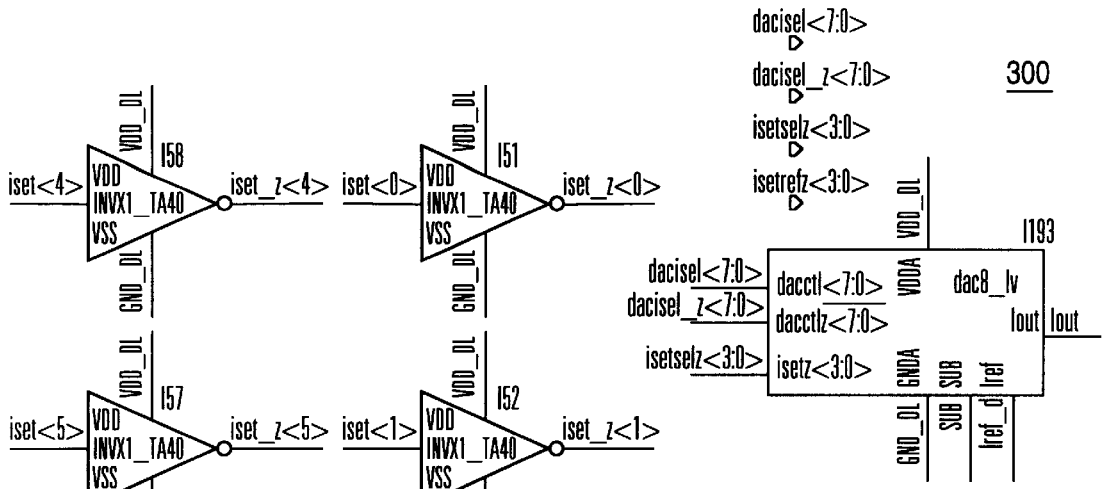
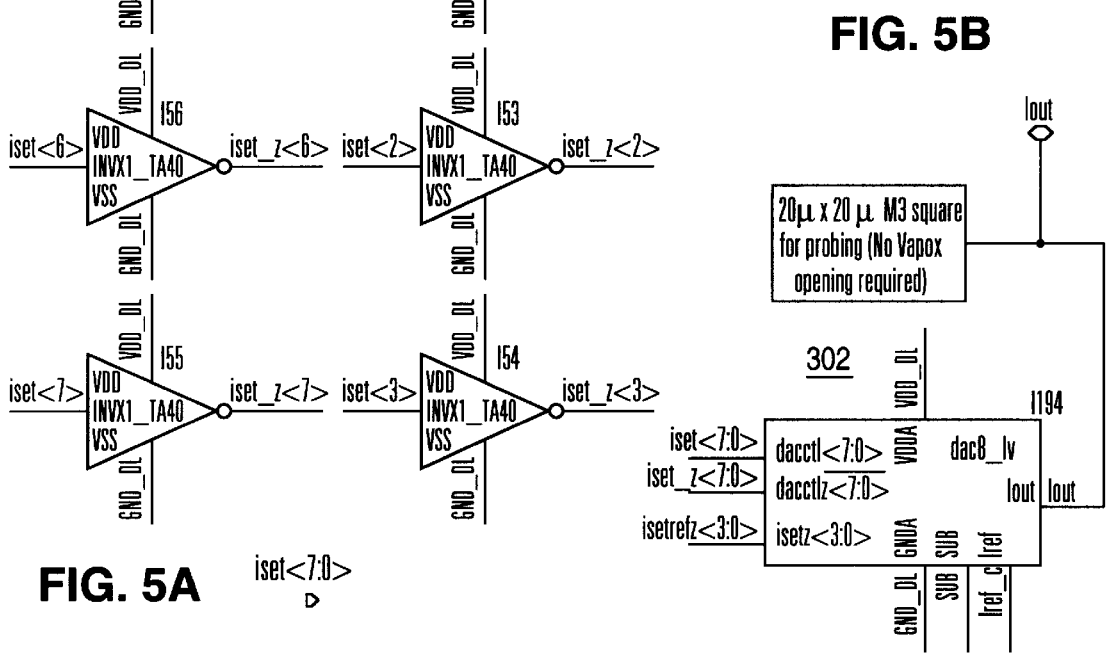
FIG. 5A
FIG. 5B
FIG. 5C
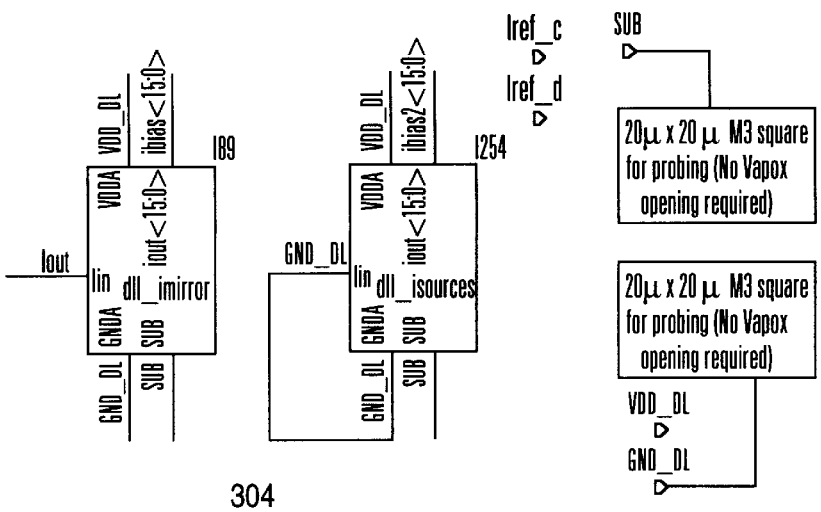
FIG. 5D

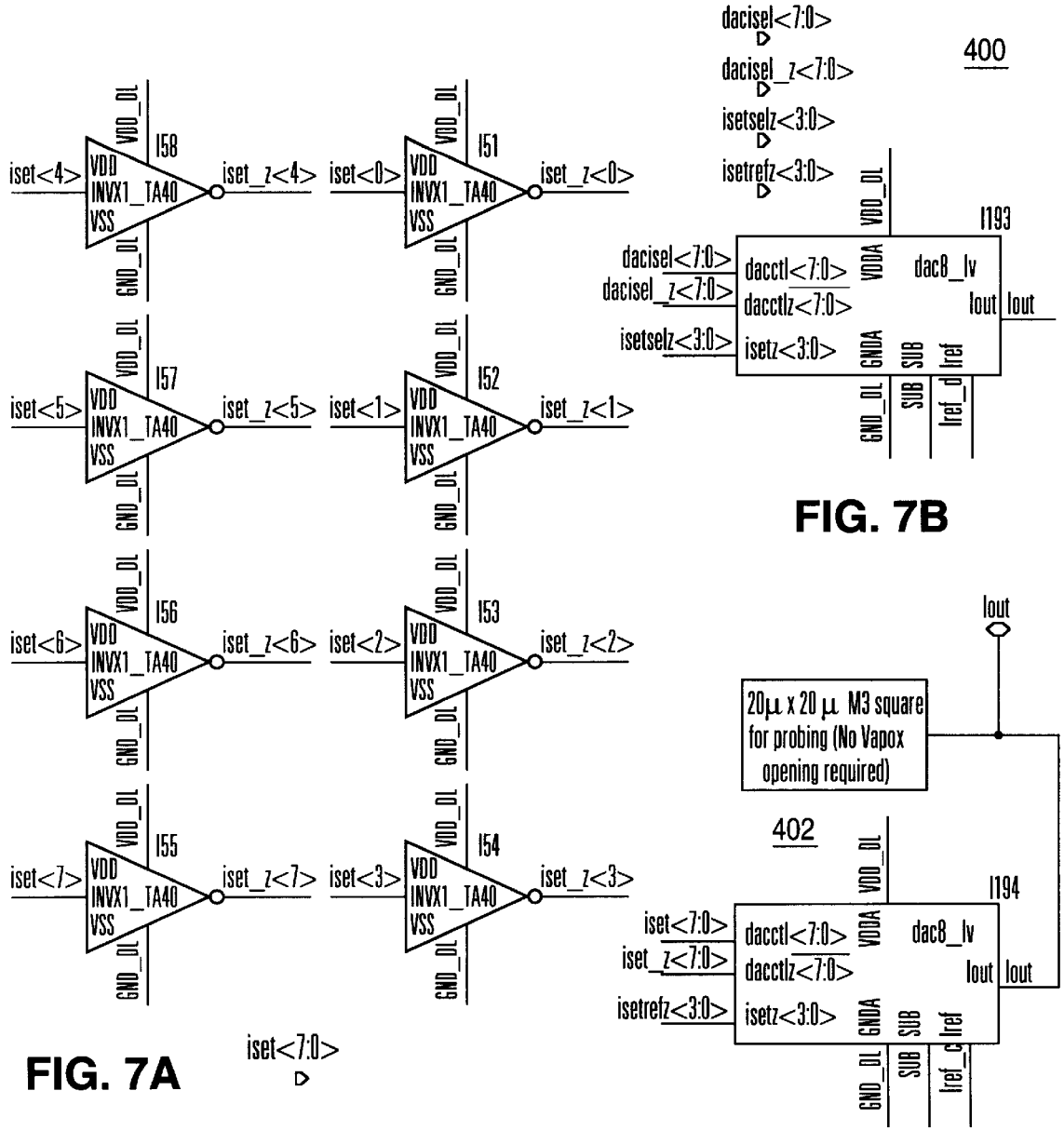
FIG. 7A
FIG. 7B
FIG. 7C
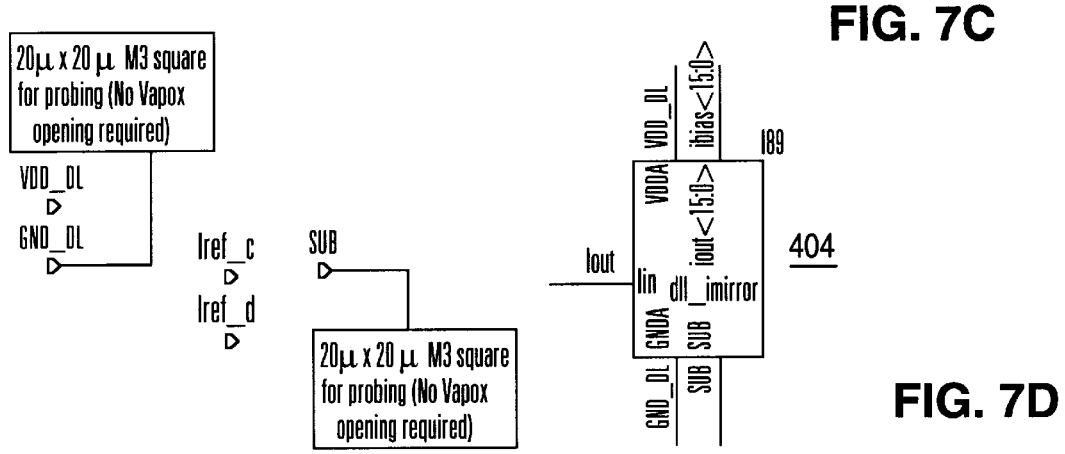
FIG. 7D

DELAY LOCKED LOOP (DLL) BASED CLOCK SYNTHESIS

TECHNICAL FIELD

The present invention is directed to the generation of high frequency clock signals and, more specifically, to frequency multiplication of a reference clock signal without the use of a voltage controlled oscillator, thus eliminating the accumulated jitter of the VCO stages and reducing the jitter on the synthesized clock signal.

BACKGROUND OF THE INVENTION

High frequency clock synthesis is typically achieved by using a phase locked loop (PLL) to multiply up a reference clock signal to a frequency which is an integer multiple of the reference frequency. This is done by placing a divide-by-N element in the feedback path of the PLL, N being the desired multiplication factor. To accomplish noninteger multiplication of the reference clock frequency, a divide-by-M element can be placed at the input to the phase comparator, dividing the reference clock by M. In this manner, frequency multiplication by a factor N/M may be accomplished.

Prior art clock synthesizers typically use a voltage controlled oscillator (VCO) to synthesize the clock. A phase comparator compares the phase and frequency of the divided down synthesized clock to the reference clock, filters the phase/frequency error, and uses this signal to adjust the VCO frequency. This is done until the divided VCO clock is equal in frequency and phase to the reference clock. At this point, the VCO clock frequency itself is equal to exactly N times the reference clock frequency and is in phase with it.

A figure of merit of a clock generator is the amount of jitter on the synthesized clock signal. Noise sources on an integrated circuit die can cause the delay through the VCO stages to vary as the noise changes the instantaneous voltage across the delay stage. Differential delay stages can reduce this problem, but do not completely remove this source of jitter. Since a VCO is a closed loop of delay stages, the jitter accumulated through all of the VCO stages is used as an input of the VCO. This causes a further accumulation of the jitter and has been shown to increase the clock jitter by a factor of 10 to 100 above that of a clock edge propagating through an open delay chain. For example, if the edge jitter observed on the output of an open delay line is equal to lops (pico-seconds), then, if the delay line is closed (forming a VCO), the delay would increase by a factor of 10 to 100. The accumulation factor decreases as the bandwidth of the loop increases. A side effect of this jitter accumulation is low frequency jitter in the VCO, which causes the synthesized clock signal to be frequency modulated by a low frequency sine wave of frequency close to the PLL bandwidth.

Another source of jitter in the synthesized clock signal is the jitter introduced by the reference clock signal itself. Even with a perfect reference clock, the PLL uses a buffered version of this clock, where the delay through the buffer can be modulated by substrate noise.

These two sources of jitter, VCO noise and reference clock noise, result in a competing tradeoff between low and high loop bandwidth. A narrow band PLL will filter out the reference clock noise, but will give a higher jitter accumulation factor in the VCO. A wide band PLL will reduce jitter accumulation, but will permit more reference clock noise to be added to the clock jitter. Another side effect of very wide loop bandwidth is a loop transfer function with a badly underdamped response. In practical terms, the jitter accumulation factor will be a minimum of around 10.

Another problem with VCO based clock synthesizers is that the VCO jitter accumulation factor is proportional to the multiplication factor. This is because a divide by N in the feedback path implies that the VCO only gets corrected every N VCO cycles. This has the effect of narrowing PLL bandwidth.

What is desired is a circuit for synthesizing a clock signal having a frequency which is a multiple of a reference clock frequency and which does not suffer from the jitter and noise problems of existing VCO based circuits.

SUMMARY OF THE INVENTION

The present invention is directed to a delay locked loop (DLL) based clock signal synthesizer which overcomes the accumulated jitter and reference clock noise problems of VCO based circuits. The VCO is replaced by a multi-stage delay line formed by differential variable delay elements. The outputs of the delay stages are fed into differential XOR gates. The outputs from the differential XOR gates are fed into a multi-input differential NOR gate. Both the reference clock and the delay line output are the inputs to a phase comparator contained in a DLL loop logic block which converts the differential inputs to single ended and uses a digital loop to provide proportional control to correct any detected phase error. The output of the digital loop logic is a vector that is used to control a current digital-to-analog converter, which is used to mirror a control current to the delay stages of the delay line. The amount of mirrored current controls the delay of the delay stages. The frequency multiplication factor of the clock generating circuit may be adjusted by changing the number of delay elements in the delay chain. The period of the synthesized clock signal will be proportional to the number of delay elements.

Thus, a clock signal synthesizer in accordance with the present invention results in a number of advantages over conventional VCO-based clock generators. First, since there is no VCO, there is no jitter accumulation. Therefore, the loop can be narrow bandwidth and optimized to filter out noise on the reference clock. Second, there will be no low frequency jitter on the synthesized clock. Third, since there is no jitter accumulation, the total jitter on the synthesized clock signal will be a factor of 10 to 100 less than that of VCO type synthesizers. Also, there is one less pole in the loop transfer function (VCO adds pole, since it is a perfect integrator). Furthermore, the jitter accumulation is not proportional to the multiplication factor, since the jitter accumulation factor is always equal to one.

Further objects and advantages of the present invention will become apparent from the following detailed description and accompanying drawings which set forth an illustrative embodiment in which the principles of the invention are utilized.

BRIEF DESCRIPTION OF THE DRAWINGS

FIGS. 5A–5F are is a schematic diagrams illustrating the cgm_dl module of FIG. 3 in greater detail.

FIGS. 7A–7E are is a schematic diagrams illustrating the pgm_dl module of FIG. 3 in greater detail.

DETAILED DESCRIPTION OF THE PREFERRED EMBODIMENT

In the following detailed description, the invention will be described in the context of a 25 Mhz reference clock used to synthesize a 250 Mhz clock signal. Those skilled in the art will appreciate that other combinations of initial reference clock frequency and synthesized multiples of that frequency are included within the concepts of the invention.

Figure 1:
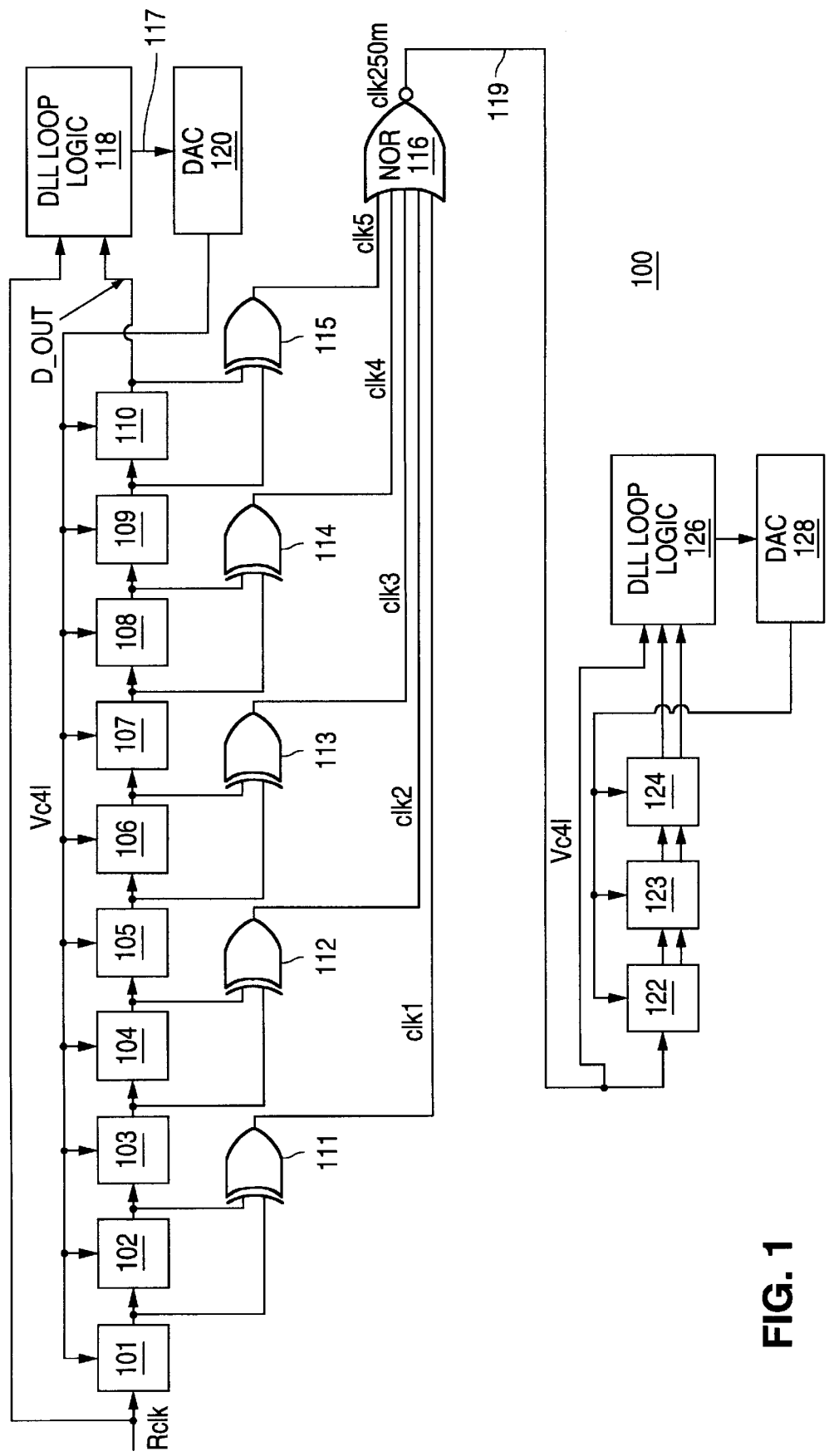
FIG. 1 is a block diagram illustrating a DLL based clock synthesizer circuit in accordance with the present invention.

FIG. 1 shows an embodiment of a DLL based clock synthesizer circuit 100 in accordance with the present invention. The VCO found in other clock synthesizing circuits is replaced by a multi-stage delay line (in this case 10 stages) formed by differential variable delay elements 101 to 110. As shown in FIG. 1, the two outputs of each consecutive pair in the sequence of delay stages 101–110 are fed into corresponding differential XOR gates 111–115. The outputs from differential XOR gates 111–115 are fed into a five-input differential NOR gate 116. The reference clock signal (labelled "RCLK" in FIG. 1) and the delay line output D_OUT are the inputs to the phase comparator of DLL loop logic block 118, which converts the differential inputs to single ended, and uses a digital loop to provide proportional control to correct any detected phase error. The output 117 of digital loop logic block 118 is a 12 bit vector used to control current digital-to-analog converter (DAC) 120, which is used to mirror a control current to the delay stages 101–110 of the delay line, with the amount of current controlling the magnitude of the delay in each stage.

Figure 2:
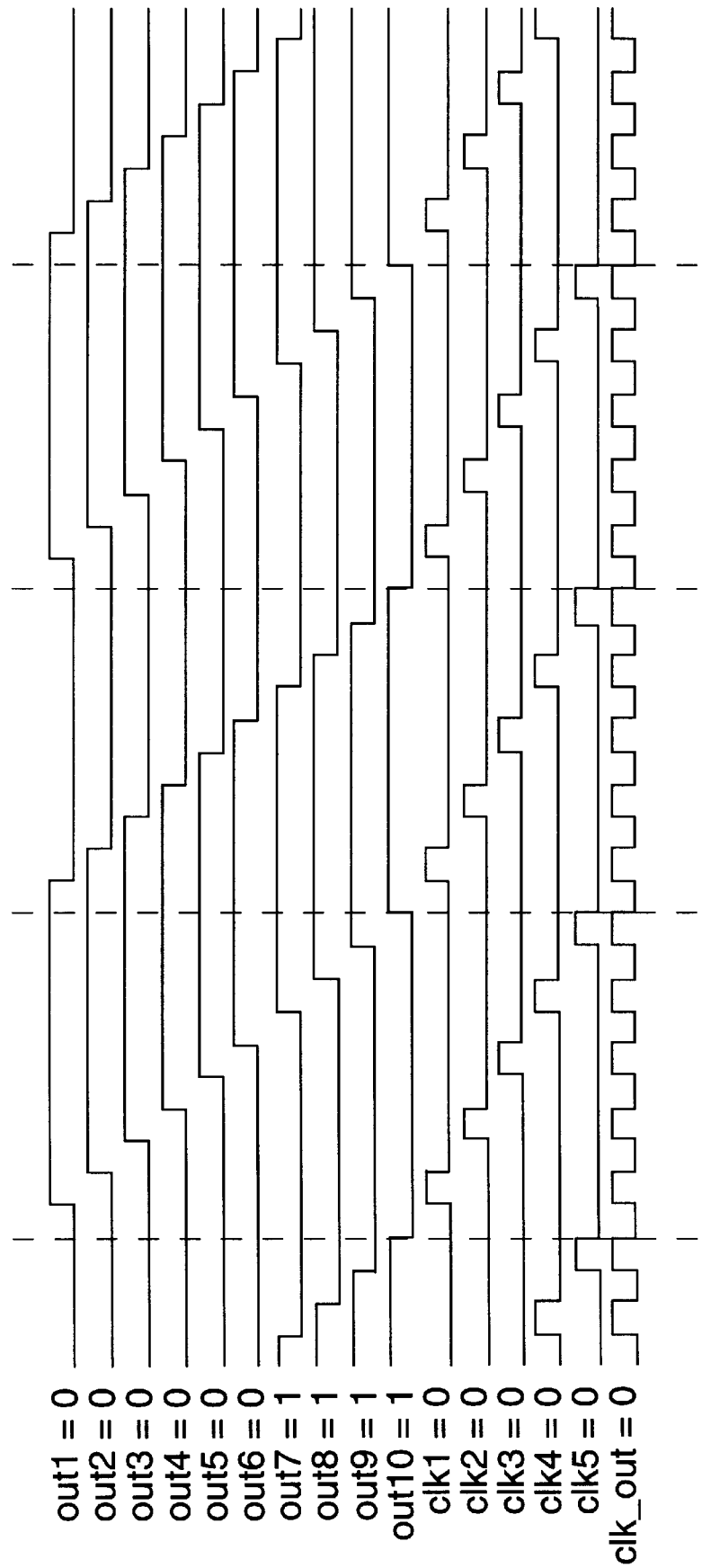
FIG. 2 is a timing diagram illustrating the waveforms and relative timing of the outputs of the delay stages and final synthesized clock for a DLL based clock synthesizer circuit in accordance with the present invention.

The following hardware description language shows the generation of the 250 mhz clock from the delay line. The signal names may be understood with referenced to the FIG. 2 timing diagram.

```
wire #delay out1 = clk;
wire #delay out2 = out1;
wire #delay out3 = out2;
wire #delay out4 = out3;
wire #delay out5 = out4;
wire #delay out6 = out5;
wire #delay out7 = out6;
wire #delay out8 = out7;
wire #delay out9 = out8;
wire #delay out10 = out9;

wire clk1 = out1 ^ out2;
wire clk2 = out3 ^ out4;
wire clk3 = out5 ^ out6;
wire clk4 = out7 ^ out8;
wire clk5 = out9 ^ out10;

wire clk_out = clk1 | clk2 | clk3 | clk4 | clk5;
```

When the above-described delay loop is in lock, the delay through the delay line will be exactly 40 ns, with the delay through each delay element being exactly 4 ns. The output of NOR gate 116 will be a differential 250 Mhz clock. The delay through the XOR gates 111–115 and NOR gate 116 can be kept under 1 ns. Therefore, at most, this will increase the overall jitter by 25%, since it is the variation in delay arising from power supply noise that causes the bulk of the jitter.

The differential 250 Mhz clock signal 119 will, therefore, have jitter of 1.25*Xps, where X is the amount of jitter introduced by delay modulation of the delay line by power supply noise. For comparison, a PLL clock synthesizer using a VCO with loop bandwidth such that the jitter accumulation factor is 30 would have a jitter of 30*Xps.

If multiple phases of the synthesized clock are required, a second N stage DLL can be used to create 2*N phases of the clock. In FIG. 1, for example, delay stages 122–124 are adjusted such that the rising edge to rising edge delay is exactly 4 ns by using DLL loop logic 126 and DAC 128, where these circuits can be identical to DLL loop logic 118 and DAC 120. The delay line formed from delay stages 122–124 outputs 6 phases of a 250 Mhz clock signal, evenly spaced by 667 ps. The second stage DLL adds more jitter. If correlated noise in both delay lines is assumed (a pessimistic assumption), then the total jitter will be 1.25*2*Xps, or 2.5*Xps. Note that the factor of 2.5 is still quite a bit better than the factor of 30 for the PLL synthesizer.

An additional benefit of the present invention is that achieving the accumulation factor of 30 required a mid-bandwidth PLL, a compromise between rejecting high frequency noise on the reference clock and reducing the accumulation factor. Since the DLL clock synthesizer of the present invention can be operated with extremely narrow bandwidth, the clock jitter component added by phase noise on reference clock is reduced.

The frequency multiplication factor may be adjusted by changing the number of delay elements in the delay chain formed by delay elements 101–110. The period of the synthesized clock will be equal to RCLK*N, where N is the number of delay elements. For example, a five-stage delay line will give a period of 8 ns, while a nine-stage will give a period of 4.444 ns.

Figure 3:
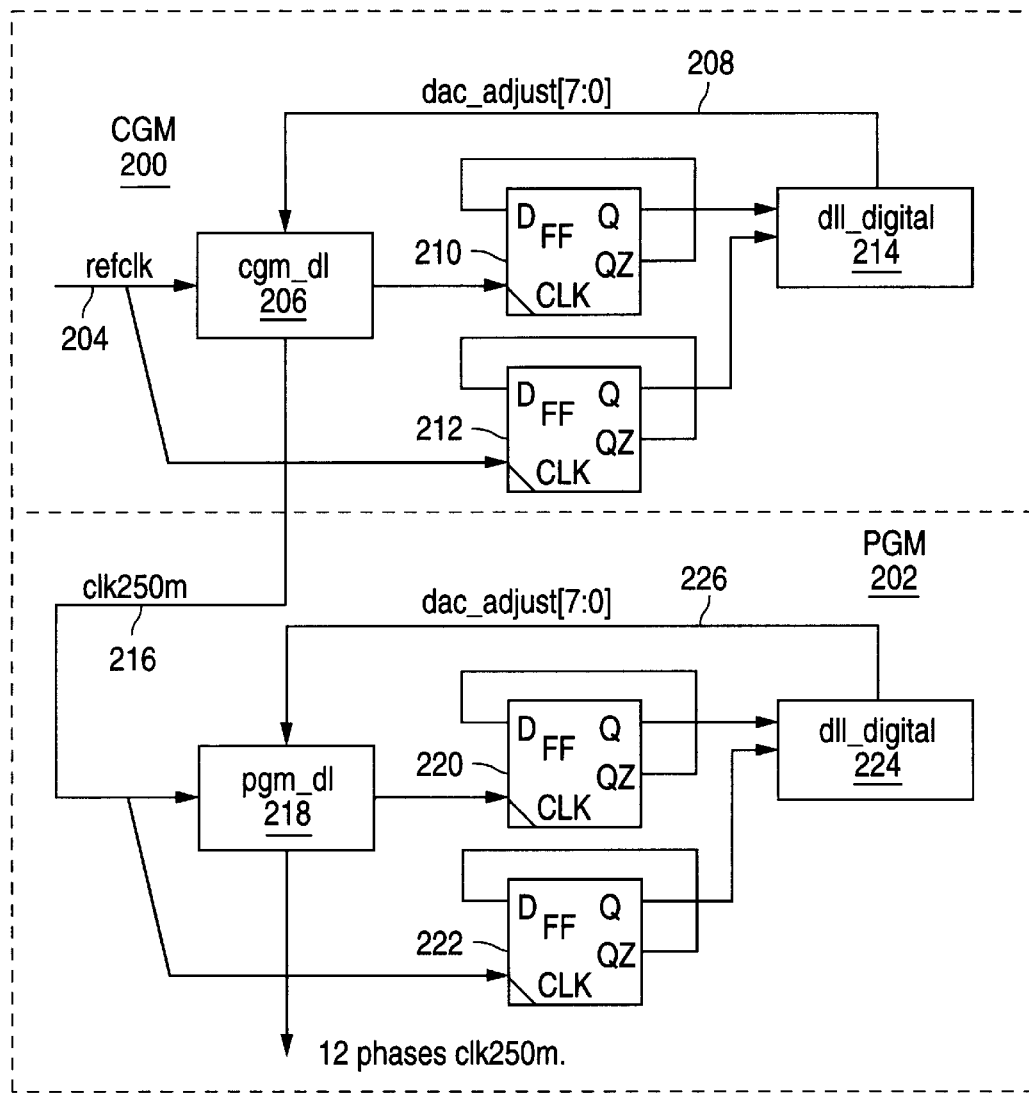
FIG. 3 is a block diagram illustrating utilization of the present invention to implement a 250 Mhz clock generation module (CGM), and also to provide 12 phases of this 250 mhz clock in a phase generation module (PGM).

The following description refers to FIG. 3, and is directed to utilization of the present invention to implement a 250 Mhz clock generation module 200 (CGM), to provide twelve phases of this 250 mhz clock in a phase generation module 202 (PGM), and also to provide an implementation of the invention that can use a reference clock with a non-perfect duty cycle. A reference clock frequency of 25 Mhz is assumed.

Refclk 204 is a reference clock signal and is input to cgm_dl module 206. Cgm_dl 206 has the ability to delay it's input in response to dac-adjust [7:0] signal 208 such that a delay from input to output of 40 ns is attainable over PVT with the correct dac-adjust setting. The output of cgm_dl 206 is the input to a divide-by-two flip-flop 210.

Refclk 204 is also the CLK input to divide-by-two flip-flop 212. The output of the two divide-by-two flip-flops (210 and 212) are the inputs to dll_digital module 214. Dll_digital 214 compares the phase of the two divide-by-two flops and adjusts dac_adjust[7:0] signal 208 until they are in phase. When they are in phase, the delay through cgm_dl 206 is exactly 40 ns.

In the form to be described, cgm_dl 206 contains a delay line of twenty variable delay stages, the odd outputs of which are connected to input A of an AND gate, and the even outputs of which are inverted and connected to the B input of an AND gate. The outputs of the ten AND gates are ORed, creating the 250 Mhz clock signal.

The 250 Mhz clock signal clk250 m 216 is provided as an input to pgm_dl module 218. Pgm_dl 218 has the ability to delay it's input in response to dac_adjust[7:0] signal 226 such that a delay from input to output of 4 ns is attainable over PVT with the correct dac-adjust setting. The output of pgm_dl 218 is the input to a divide-by-two flip-flop 220. Clock signal 216 is also the CLK input to divide-by-two flip-flop 222. The output of the two divide-by-two flip-flops (220 and 222) are the inputs to dll_digital 224. Dll_digital 224 compares the phase of the two divide-by-two flip-flops and adjusts dac_adjust[7:0] signal 226 until they are in phase. When they are in phase, the delay through pgm_dl 218 is exactly 4 ns.

Pgm_dl 218 contains a delay line of twelve variable delay stages. Since the total delay is 4 ns, the difference in phase between delay stages will be 333 ps. This provides as an output the twelve phases of a 250 Mhz clock signal.

Figure 4:
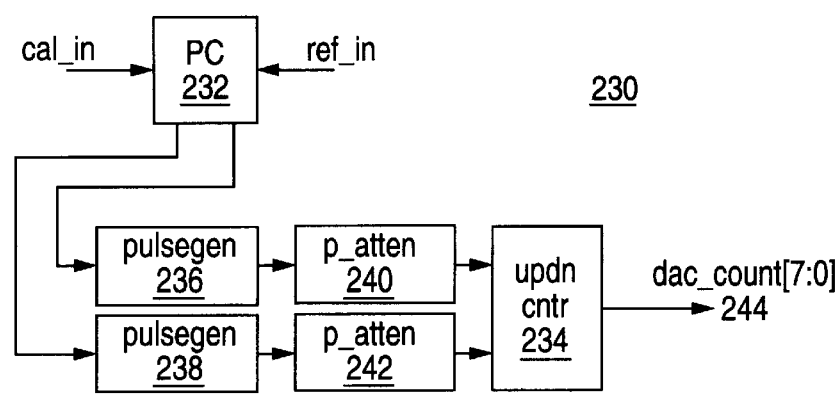
FIG. 4 is a block diagram illustrating dll_digital modules 214 and 224 of FIG. 3.
Figure 5E:
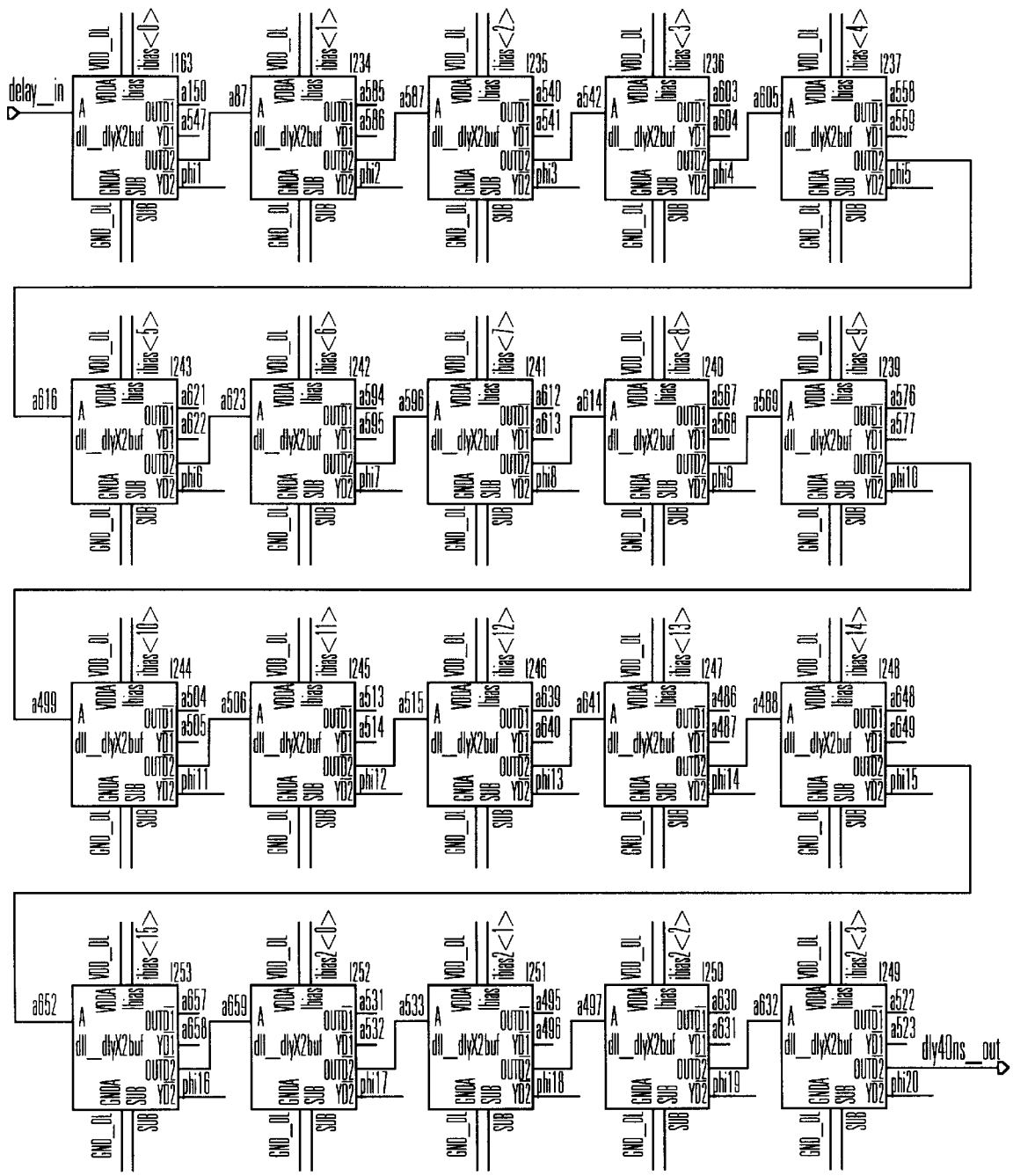
Figure 5F:
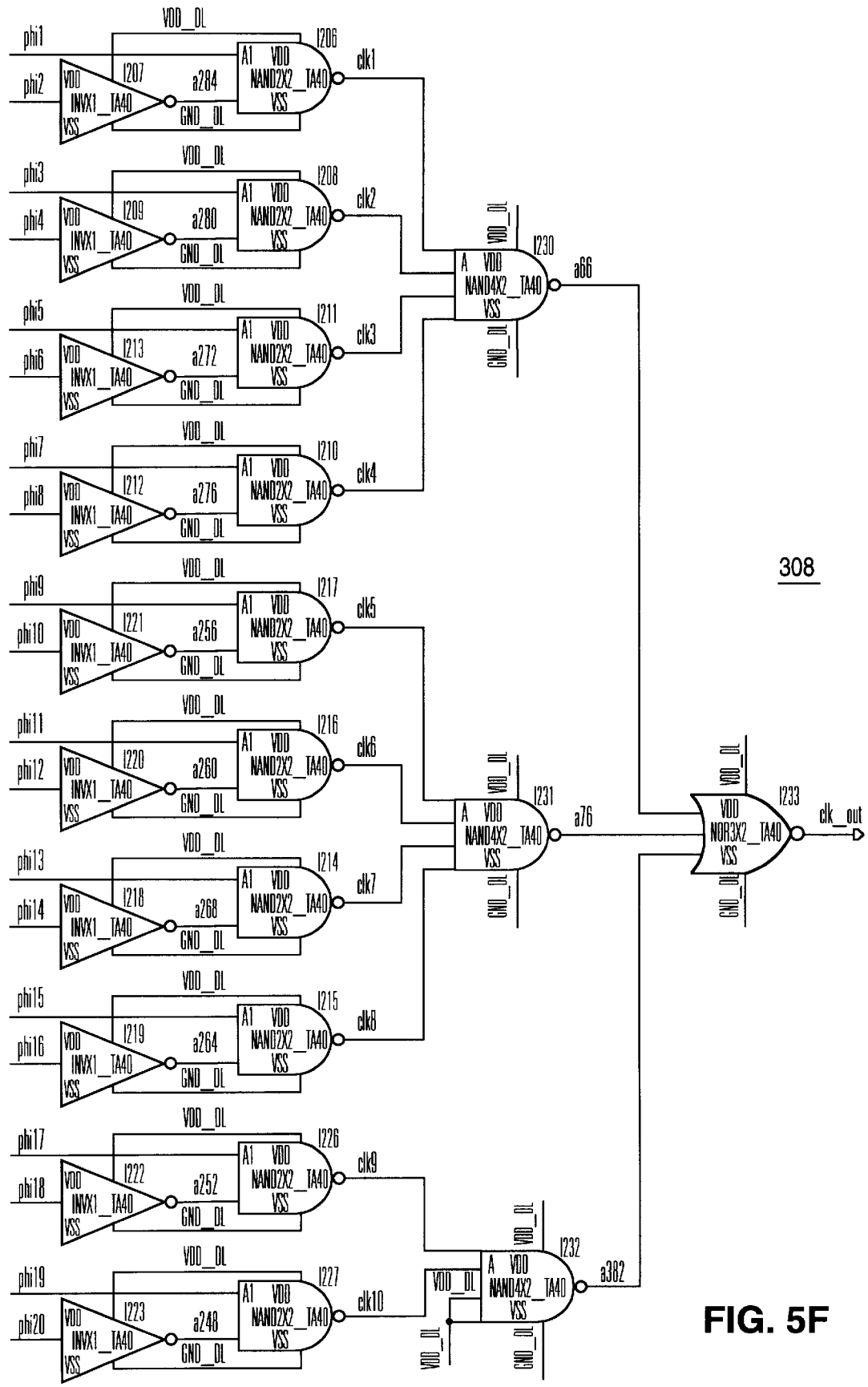

The dll_digital module(s) will now be described in greater detail. FIG. 4 shows the elements of dll_digital modules 214 and 224 in greater detail. Dll_digital block 230 contains a phase comparator 232, which includes a special flip-flop with a symmetric setup and hold window of under 50 ps. The Q and QZ outputs of the phase comparator flop are multiplexed. When the select of the multiplexer is high, Q becomes the output signal "down", and QZ becomes the signal "up". If the select is low, these are flipped. The reason for this is that both the non-delayed signal and the output of the delay line are divided by two before entering the phase detector. This gives a 50% duty cycle, which is necessary for proper phase detector operation. However, it is not possible to guarantee that both divide-by-two's reset in phase. Therefore, the phase detector takes advantage of the fact that, at reset, the DAC resets to a value giving minimum delay, which guarantees a leading phase error.

If the updn counter 234 is at full count (min delay) and phase comparator 232 output is "down", then the divide-by-two's have reset to complementary phases and the slope of the loop is reversed. The condition of updn_cntr count ==full && "down" is sampled at the rising edge of the clock, causing the multiplexer select to toggle. Not only does this guarantee correct slope at power up, but it is also self correcting. For example, if a large noise spike caused the flop holding the state of select to toggle, and leading errors are treated as lagging, then the loop would cause the updn counter to go to full count, where the condition of full_cnt && "down" would be detected, and the slope of the loop would be corrected.

Signal "down" is an input to pulse generator 236, which creates a pulse synchronous to clk every time "down" is sensed true at the rising edge of the CLK input to phase comparator 232. Signal "up" is the input to pulse generator 238, which creates a pulse synchronous to clk25 Mhz every time "up" is sensed true at the rising edge of CLK input to phase comparator 232. The output of pulse generator 236 is a pulse density modulated pulse stream where the pulse density is proportional to the amount of samples where the cal_in input to phase comparator 232 lags the ref_in input. The output of pulse generator 238 is a pulse density modulated pulse stream where the pulse density is proportional to amount of samples where the calvin input to phase comparator 232 leads the ref_in input. The pulse stream output from pulse generator 236 is attenuated by pulse stream attenuator 240, while the pulse stream output from pulse generator 238 is attenuated by pulse stream attenuator 242.

A pulse stream attenuator is a counter that counts input pulses and creates an output pulse upon counting a programmable number of input pulses. This allows programming the amount of proportional control for the loop. The output of pulse stream attenuators 240 and 242 are input to updn counter 234. This counter starts at full count (min delay) and counts up or down in response to the pulse outputs from the pulse attenuators. A pulse input from pulse attenuator 240 will cause the count to increase by one, while a pulse input from pulse attenuator 242 will cause the count to decrease by one. The updn counter output is used to adjust the output of a current DAC to adjust the delay by means of dac_count [7:0] signal 244. The dll_digital loop logic runs off of the clk input, with lead and lag errors synced to this clock in the pulsegen blocks.

A hdl for the operation of the FIG. 4 dll_digital block is provided below.

| hdl |
|---|
| module dll_digital(cal_in,ref_in,reset,clk,gain_z, dac_count,dac_count-Z, clk_byp, testen,tclk, pu_test,pd_test,pump_test); |
| input pu_test; //when pump_test asserted, creates an artificial //lag error when pulsed for at least 1 clk period //(edge detected internal) |
| input pd_test; //when pump_test asserted, creates an artificial //lead error when pulsed for at least 1 clk period //(edge detected internal) |
| input pump_test; //enables pump test mode |
| input cal_in; //output of delay line |
| input ref_in; //input to delay line |
| input reset; //reset |
| input clk; //up to a 125mhz clock used to clock loop logic |
| input clk_byp; //selects tclk in place of clk for ATPG |
| input testen; //shift enable for scan flops |
| input tclk; //test clock for ATPG |
| input [7:0] gain_z; //sets the loop gain, higher value = lower gain |
| output [7:0] dac_count,dac_count z; //used to adjust current in current DAC |

The operation of the cgm_dl and pgm_dl modules shown in FIG. 3 will now be described in greater detail with reference to the FIGS. 5A–5F schematics and the FIGS. 7A–7E schematics.

Referring to FIGS. 7A–7E, 8 bit current DAC 300 creates a current the magnitude of which is determined by dac_iselect[7:0], the output of the loop's updn_cntr. 8 bit current DAC 302 is hard-wired to create a DC current that sets the operating point that DAC 300 moves around. The output currents are summed and input to current mirror 304, which provides a current to control the delay through delay line 306. Combinational logic 308 is used to synthesize a 250 Mhz clock from the delay line taps, as shown in the following hdl:

| hdl |
|---|
| wire clk1 = !(out1 & !out2); |
| wire clk2 = !(out3 & !out4); |
| wire clk3 = !(out5 & !out6); |
| wire clk4 = !(out7 & !out8); |
| wire clk5 = !(out9 & !out10); |
| wire clk6 = !(out11 & !out12); |
| wire clk7 = !(out13 & !out14); |
| wire clk8 = !(out15 & !out16); |
| wire clk9 = !(out17 & !out18); |
| wire clk10 = !(out19 & !out20); |

-continued hdl

```
wire clk_out_1 = !(clk1 & clk2 & clk3 & clk4);
wire clk_out_2 = !(clk5 & clk6 & clk7 & clk8);
wire clk_out_3 = !(clk9 & clk10 & 1'b1 & 1'b1);
wire clk_out = clk_out-1 | clk_out_2 |
               clk___out_3.
```

Figure 6:
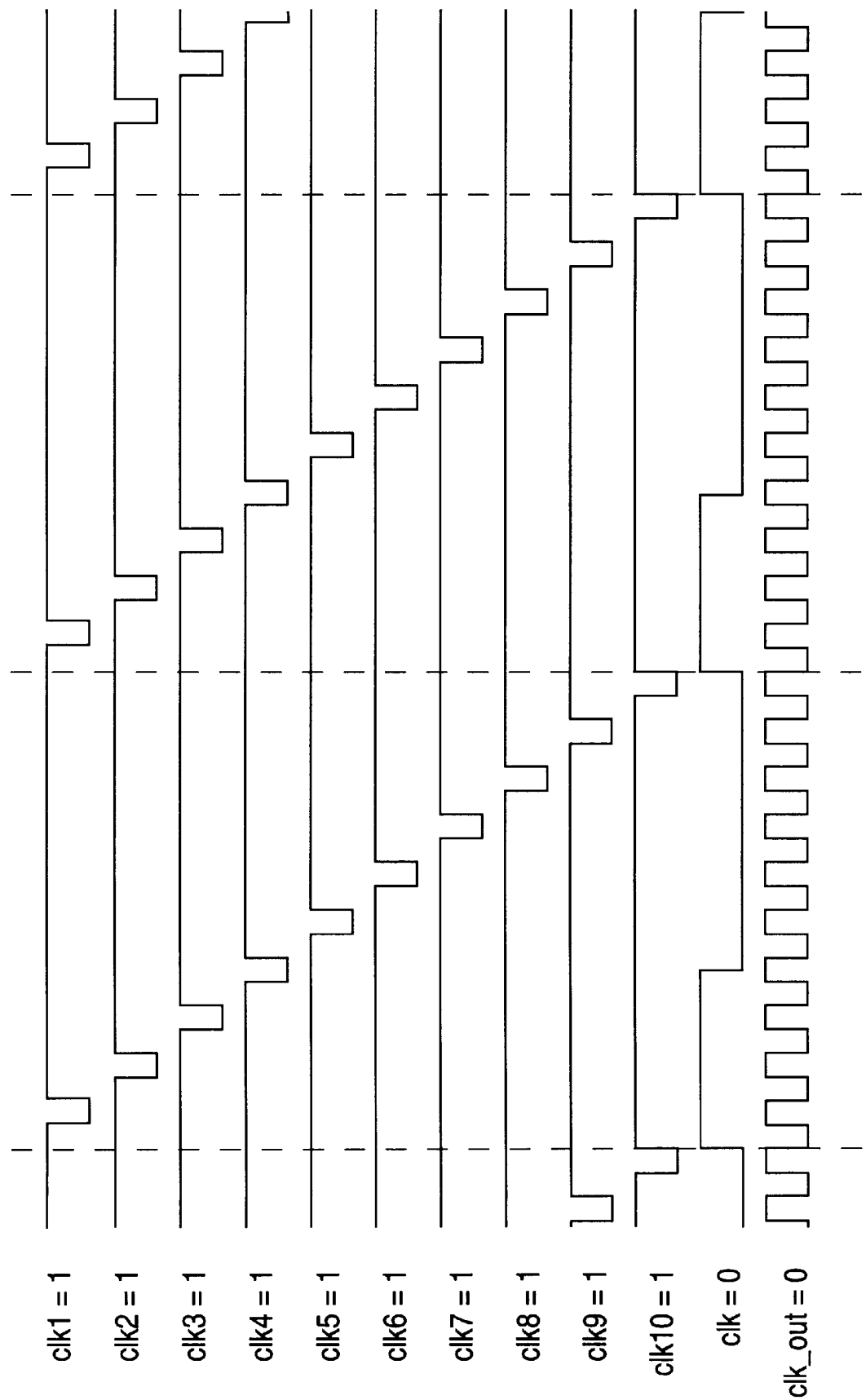
FIG. 6 is a simulated oscilloscope trace showing timing waveforms for clock synthesis with non-50% high time.
Figure 7E:
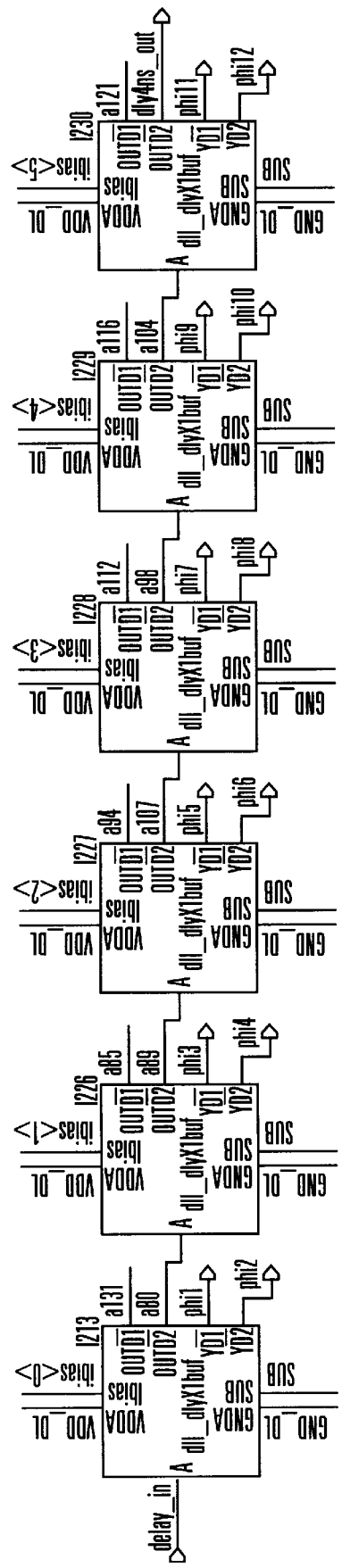

Each inverter/AND gate combination in combinational logic 308 is used to edge detect the rising edge of refclk as it propagates through delay line 306. When the loop is in lock, these edges will span exactly 40 ns, and can be combined to create a 250 Mhz clock. The waveforms of FIG. 6 show clock synthesis with a non-50% high time, showing that this method works even without a perfect duty cycle.

Referring to FIG. 7, 8 bit current DAC 400 creates a current the magnitude of which is determined by dac-iselect [7:0], the output of the loop's updn_cntr. 8 bit current DAC 402 is hard-wired to create a DC current that sets the operating point that DAC 400 moves around. The output currents are summed and input to current mirror 404, which provides a current to control the delay through delay line 406. When the delay through delay line 406 is exactly 4 ns, each of the twelve phases of the synthesized clock signal will be evenly spaced over a span of 4 ns.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A clock signal synthesizer for generating a synthesized clock signal, the clock signal synthesizer comprising:

a multi-stage delay line that includes a plurality of variable delay elements, each delay element providing an output, and wherein a first element of the plurality of elements receives a reference clock signal as an input;

a plurality of differential XOR gates disposed such that the two outputs of each consecutive pair of delay elements in the multi-stage delay line are provided as inputs to a corresponding one of the differential XOR gates:

a multi-input differential NOR gate connected to receive an output from each of the differential XOR gates, the differential NOR gate providing the synthesized clock signal as an output;

delay locked loop logic circuitry that receives the reference clock signal and the output of a final delay element in the multi-stage delay line as inputs and provides a multi-bit vector as an output; and a current digital-to-analog converter that receives the multi-bit vector as an input and mirrors a corresponding control current to each of the delay elements in the multi-stage delay line such that the amount of mirrored current controls the delay of the delay elements.

2. A clock signal synthesizer as in claim 1, and wherein the period of the synthesized clock signal is proportional to the number of delay elements included in the multi-stage delay line.

* * * * *